United States Patent [19]
Spence et al.

[11] Patent Number: 5,486,795
[45] Date of Patent: Jan. 23, 1996

[54] LOW POWER CRYSTAL OSCILLATOR

[75] Inventors: John R. Spence, Villa Park; Rajiv Gupta, Brea; Mingming Zhang, Alhambra, all of Calif.

[73] Assignee: Rockwell International Corporation, Seal Beach, Calif.

[21] Appl. No.: 51,134

[22] Filed: Apr. 22, 1993

[51] Int. Cl.⁶ ................................ H03B 5/06; H03B 5/36
[52] U.S. Cl. ..................... 331/116 FE; 331/158
[58] Field of Search .......................... 331/116 FE, 116 R, 331/158

[56] References Cited

U.S. PATENT DOCUMENTS 4,282,496  8/1981  Huener ............................. 331/116 FE

FOREIGN PATENT DOCUMENTS 52-21754  2/1977  Japan ................................. 331/116 FE
54-151357 11/1979  Japan ................................. 331/116 FE
55-3263    1/1980  Japan ................................. 331/116 FE

*Primary Examiner*—Andrew M. Dolinar
*Attorney, Agent, or Firm*—George A. Montanye; Charles T. Silberberg; Tom Streeter

[57] ABSTRACT

The LOW POWER CRYSTAL OSCILLATOR shown here reduces power consumption of a Pierce oscillator which has an inverter preferably made of an NFET N0 and a PFET P0 in series. A load, preferably an NFET N1 with its gate wired to its source, is placed in parallel with a switch, preferably a PFET P1, between P0 and Vcc. A clamp, preferably a PFET P2 with its gate wired to its source, is placed in parallel with a switch, preferably an NFET N2, between N0 and ground. The switches are enabled during power-up, thereby providing quick turn-on of the oscillator. They are then disabled, thereby reducing the voltage across the crystal XTAL and consequently reducing the power consumed.

8 Claims, 2 Drawing Sheets

5,486,795

LOW POWER CRYSTAL OSCILLATOR

BACKGROUND OF THE INVENTION

The present invention relates to low power oscillators, and has particular relation to low power oscillators which must be turned on quickly.

FIG. 1 shows a Pierce oscillator. An input node XTALin and an output node XTALout are separated by an inverter, a crystal XTAL, and a resistor R, in parallel. The nodes are typically pads on an integrated circuit. The inverter comprises a PFET in series with an NFET N0. The gates of both FETs are connected to XTALin. The source of P0 is connected to Vcc. The drain of P0 and the source of N0 are connected to XTALout. The drain of N0 is grounded. An input capacitor Cin and an output capacitor Cout provide a load to the crystal XTAL, and are necessary for parallel resonance.

The power dissipated by this oscillator is proportional to the frequency of operation, the capacitance of Cin and Cout, and the square of the voltage across the crystal XTAL. It is often desired to keep this power to a minimum. The first two components are fixed: the frequency is set by the requirements of the device to be driven by the oscillator, and the capacitance is set by the requirements of the crystal. A design opportunity is presented by the third component, however: the voltage used to drive the inverter, typically 5.0 volts, is more than the 2.5 volts typically needed to maintain crystal oscillations. Power consumption could be cut by a factor of four, perhaps from 40.0 milliwatts to 10.0 milliwatts, if the crystal's voltage could be appropriately reduced.

However, starting up the crystal takes 15.0 to 30.0 milliseconds at 2.5 volts, if its starts up at all. Many applications require a start up of 1.0 to 2.0 milliseconds. A modem, for example, may transmit or receive data infrequently. Keystrokes on a keyboard may be separated by 250.0 milliseconds even when a fast typist is operating the device, and even though each key is depressed for only 5.0 to 10.0 milliseconds at a time. It makes no sense to keep the oscillator on when no key is depressed. However, waiting to turn on the oscillator, even if it can be done in the minimum 15.0 milliseconds, will lose the keystroke, even if it has the maximum 10.0 millisecond duration. Continuous 5.0 volt (40.0 milliwatt) operation of the crystal has therefore been the art's necessary, but unsatisfactory, response.

SUMMARY OF THE INVENTION

The present invention overcomes the limitations of the prior art by providing a load device in parallel with a first switch between Vcc and P0, while a clamp in parallel with a second switch is placed between N0 and ground. Both switches are enabled during power-up, thus continuing the device during power-up as a 5.0volt Pierce oscillator. After 2.0 milliseconds, however, when the crystal is assured to be oscillating, both switches are disabled. The Vcc seen by the inverter is therefore dropped by the load from the rail-to-rail 5.0volts to only 3.5 volts, while the clamp raises the ground seen by the inverter from 0.0 volts to Vss, which is typically 1.0 volt. The net voltage swing applied to the crystal is therefore 2.5 volts, the difference between 3.5 and 1.0 volts. This is exactly what is desired.

DETAILED DESCRIPTION OF THE DRAWINGS

Figure 1:
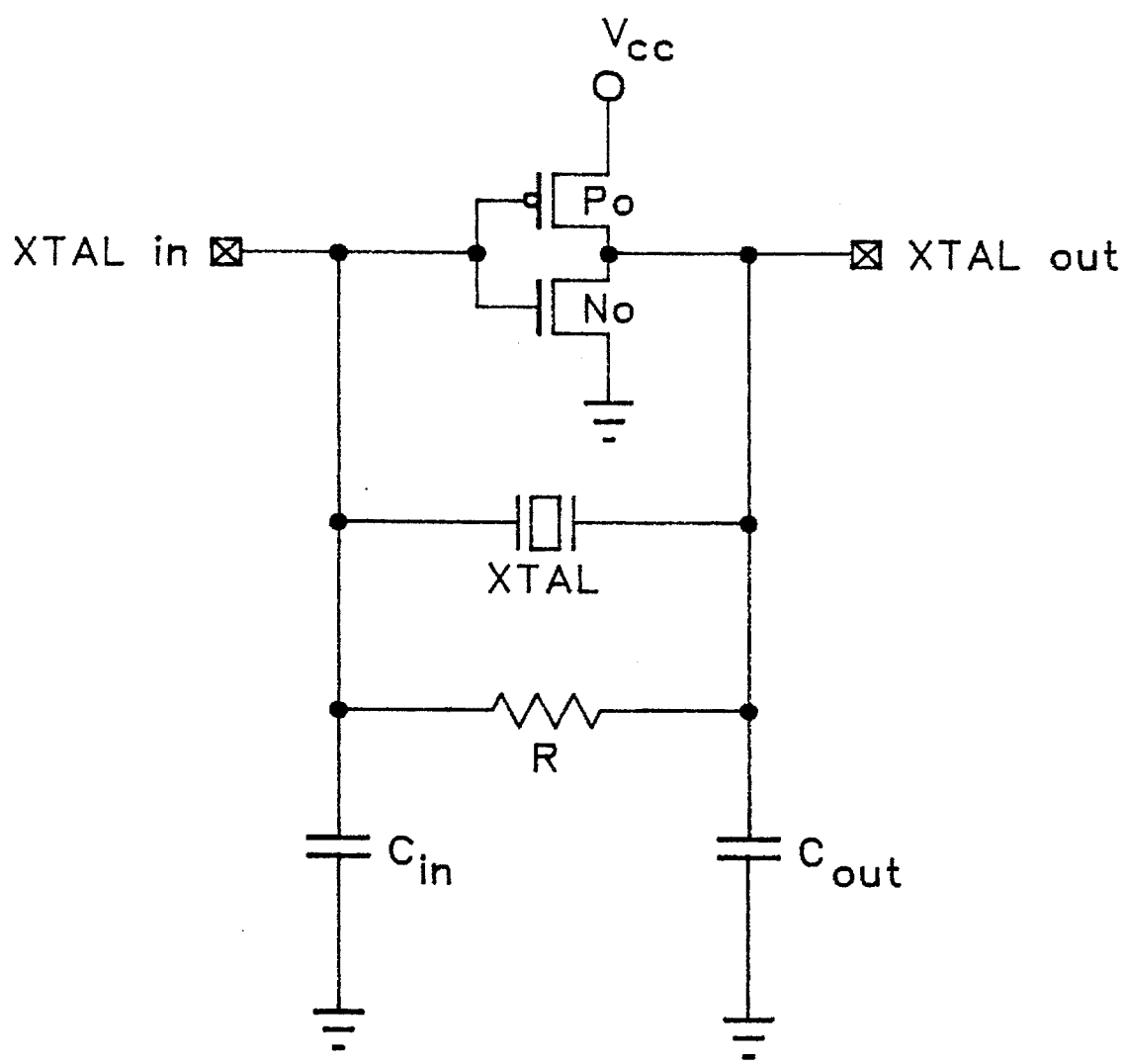
FIG. 1 is a schematic diagram of a Pierce oscillator.
Figure 2:
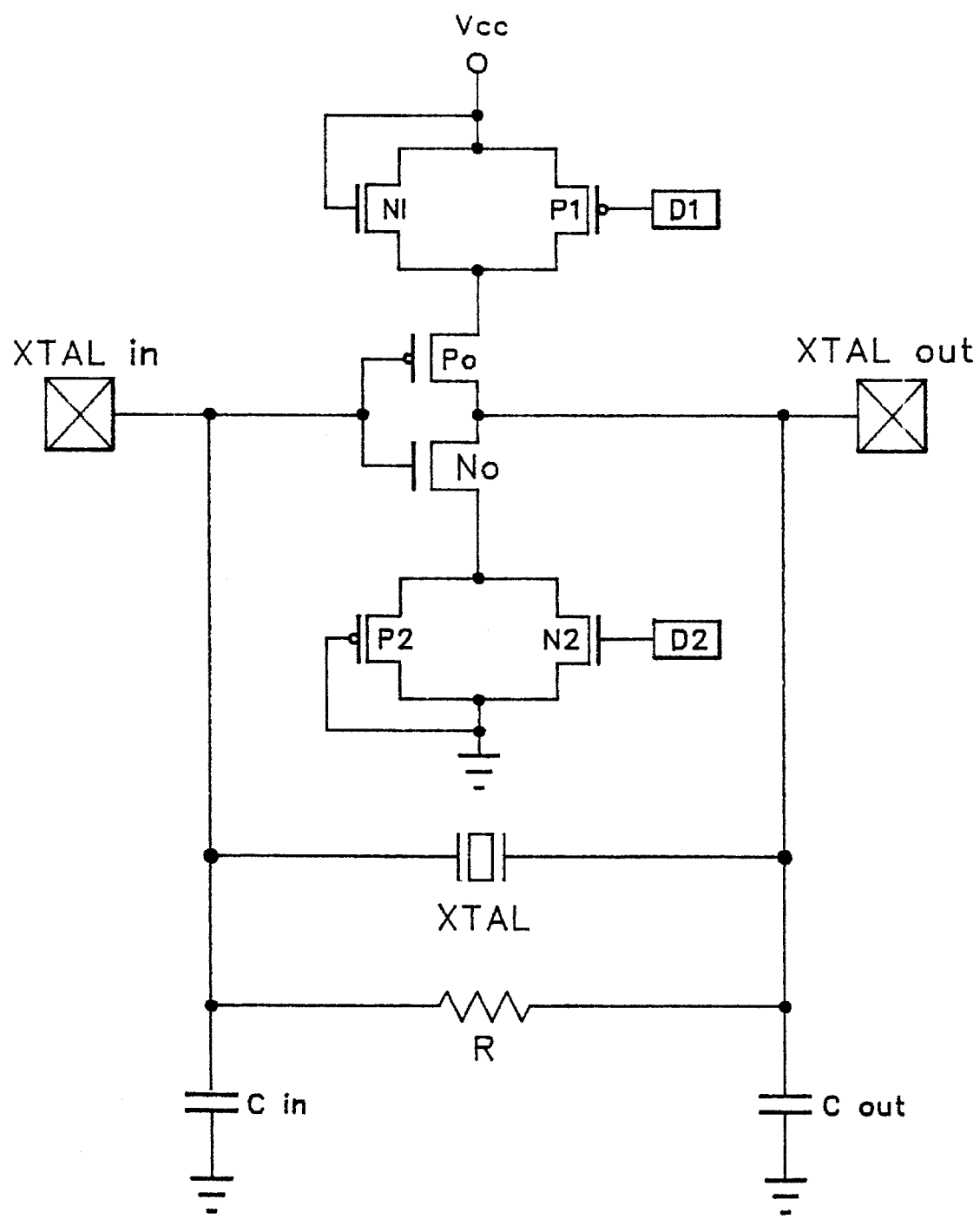
FIG. 2 is a schematic diagram of an embodiment of the present invention.

FIG. 2 shows the present invention. The load device is preferably a first NFET N1. N1's gate is tied to its source, which is tied to Vcc. Its drain is tied to the source of P0. The first switch is preferably a first PFET P1, also having its source tied to Vcc and its drain tied to the source of P0. P1's gate, however, is set to "0" on power-up. A first delay device D1, 2.0 milliseconds after power-up, changes the "0" to a "1".

Likewise, the clamp is preferably a second PFET P2. P2's gate is tied to its drain, and both are tied to ground. Its source is tied to the drain of N0. The second switch is preferably a second NFET N2, also having its source tied to the drain of N0 and its drain tied to ground. N2's gate is the inverse of P1's: it is set to "1" on power-up. A second delay device D2, 2.0 milliseconds after power-up, changes the "1" to a "0".

The first and second delay devices may have many components in common. They typically are the same device, except for the output of the device being run through an inverter in one case, but not in the other. Alternatively, the device driving or being driven by the oscillator may produce a signal 2.0 milliseconds after power-up. The nature of the source of the signal driving the switches is unimportant; its presence is vital.

Likewise, the length of the delay between power-up and the disabling of the switches need not be exactly 2.0 milliseconds. Any delay is suitable if It is as long or longer than the maximum time needed to start oscillations in the crystal, but is also as short or shorter than the minimum time needed for the device being driven by the oscillator to receive the oscillations. As noted above, this is typically the duration of a keystroke if the device thus driven is a data modem. Other things being equal, the shortest delay in the available range should be used, since this will minimize power consumption.

Further, the voltages given above are not critical. It is important only that the voltage reduction provided by the load and the clamp satisfy two criteria. First, the reduction must be more than trivial, so as to justify the addition of the extra apparatus. Second, it must be not so great as to reduce the voltage provided to the crystal to a level below the crystal's specifications.

Indeed, it is not even required that both the load and the clamp be present, although having both is preferred. If adequate results can be obtained with only one, the other may be omitted. It is preferable for the clamp to be omitted rather than the load.

Industrial Applicability

The present invention is capable of exploitation in industry, and can be used, whenever a low power, quick turn-on oscillator is desired. It can be made from components which, taken separate and apart from one another, are entirely conventional, or it can be made from their non-conventional counterparts.

While a particular embodiment of the present invention has been described in some detail, the true spirit and scope of the present invention are not limited thereto, but are limited only by the appended claims.

What is claimed is:

1. A Pierce oscillator comprising:

(a) an inverter and a crystal in parallel;

(b) a voltage source;

(c) a load and a first switch in parallel between the voltage source and the inverter, the load comprising an NFET with its gate wired to its source, and the first switch comprising a PFET;

(d) means for enabling the first switch during power-up and for thereafter disabling the first switch.

2. A Pierce oscillator comprising:

(a) an inverter and a crystal in parallel;

(b) a voltage source;

(c) a load and a first switch in parallel between the voltage source and the inverter;

(d) means for enabling the first switch during power-up and for thereafter disabling the first switch;

(e) a ground;

(f) a camp and a second switch in parallel between the inverter and the ground, the clamp comprising a PFET with its gate wired to its drain, and the second switch comprises an NFET; and (g) means for enabling the second switch during power-up and for thereafter disabling the second switch.

3. A Pierce oscillator comprising:

(a) an inverter and a crystal in parallel;

(b) a ground;

(c) a clamp and a second switch in parallel between the inverter and the ground, the clamp comprising a PFET with its gate wired to its drain, and the second switch comprises an NFET; and (d) means for enabling the second switch during power-up and for thereafter disabling the second switch.

4. A method for reducing the power consumption of a Pierce oscillator, the oscillator comprising:

(a) an inverter and a crystal in parallel; and (b) a voltage source;

wherein the method comprises the steps of:

(c) during power-up, bypassing a load which comprises an NFET with its gate wired to its source and which lies between the voltage source and the inverter, the step of bypassing the load comprising the step of enabling a first switch; and (d) after power-up, directing power through the load lying between the voltage source and the inverter, the step of directing power through the load comprising the step of disabling the first switch.

5. The method of claim 4, wherein the first switch comprises a PFET.

6. A method for reducing the power consumption of a Pierce oscillator, the oscillator comprising:

(a) an inverter and a crystal in parallel;

(b) a voltage source; and (c) a ground;

wherein the method comprises the steps of (d) during power-up, bypassing a load which lies between the voltage source and the inverter;

(e) after power, up, directing power through the load lying between the voltage, source and the inverter;

(f) during power-up, bypassing a clamp which lies between the inverter and the ground, the clamp comprises a PFET with its gate wired to its drain, and the step of bypassing the clamp comprising the step of enabling a second switch; and (g) after power-up, directing power through the clamp lying between inverter and the ground by disabling the second switch.

7. The method of claim 6, wherein the second switch comprises an NFET.

8. A method for reducing the power consumption of a Pierce oscillator, the oscillator comprising:

(a) an inverter and a crystal in parallel; and (b) a ground;

wherein the method comprises the steps of:

(c) during power-up, bypassing a clamp which lies between the inverter and the ground, the clamp comprising a PFET with its gate wired to its drain, and the step of bypassing the clamp comprising the step of enabling a second switch; and (d) after power-up, directing power through the clamp lying between the inverter and the ground by disabling the second switch.

* * * * *